(12) United States Patent
Carlson et al.

(10) Patent No.: US 7,582,969 B2
(45) Date of Patent: Sep. 1, 2009

(54) HERMETIC INTERCONNECT STRUCTURE AND METHOD OF MANUFACTURE

(75) Inventors: Gregory A. Carlson, Santa Barbara, CA (US); Jeffery F. Summers, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 342 days.

(21) Appl. No.: 11/211,625

(22) Filed: Aug. 26, 2005

(65) Prior Publication Data

US 2007/0045781 A1 Mar. 1, 2007

(51) Int. Cl.
*H01L 23/06* (2006.01)
*H01L 23/48* (2006.01)
*H01L 23/52* (2006.01)
*H01L 23/40* (2006.01)

(52) U.S. Cl. ............... 257/758; 257/417; 257/684; 257/760; 438/778; 438/787; 174/17.05; 174/50.5; 174/520

(58) Field of Classification Search ........... 257/632, 257/684, 415, 417, 414, E23.106, E23.142, 257/686, 777, E21.705, E25.013; 438/455, 438/778, 787, 109, 687, 51; 174/17.05, 50.5, 174/520; 427/468
See application file for complete search history.

(56) References Cited

U.S. PATENT DOCUMENTS

| | | | | | |
|---|---|---|---|---|---|
| 4,001,049 | A | * | 1/1977 | Baglin et al. | 250/492.3 |
| 5,861,930 | A | * | 1/1999 | Sakai | 349/106 |
| 5,901,050 | A | * | 5/1999 | Imai | 361/820 |
| 6,016,000 | A | * | 1/2000 | Moslehi | 257/522 |
| 6,255,210 | B1 | * | 7/2001 | Annapragada et al. | 438/624 |
| 6,297,072 | B1 | * | 10/2001 | Tilmans et al. | 438/106 |
| 6,486,425 | B2 | | 11/2002 | Seki | |
| 6,580,138 | B1 | | 6/2003 | Kubena et al. | |
| 6,590,283 | B1 | | 7/2003 | Zolnowski | |
| 6,675,469 | B1 | * | 1/2004 | Haba et al. | 29/830 |
| 6,746,891 | B2 | | 6/2004 | Cunningham et al. | |
| 6,818,464 | B2 | | 11/2004 | Heschel | |
| 6,876,482 | B2 | | 4/2005 | DeReus | |
| 6,917,086 | B2 | | 7/2005 | Cunningham et al. | |
| 7,005,388 | B1 | * | 2/2006 | Hopper et al. | 438/733 |
| 7,138,293 | B2 | * | 11/2006 | Ouellet et al. | 438/106 |
| 2002/0014651 | A1 | * | 2/2002 | Thomas | 257/312 |

(Continued)

OTHER PUBLICATIONS

"RF MEMS and MEMS packaging," M. Hara, et al., Second International Symposium on Acoustic Wave Devices for Future Mobile Communications Systems, Thursday, Mar. 4, 2004, pp. 115-122.

(Continued)

*Primary Examiner*—Lynne A. Gurley
*Assistant Examiner*—Meiya Li
(74) *Attorney, Agent, or Firm*—Jaquelin K. Spong

(57) ABSTRACT

A hermetic interconnect is fabricated on a substrate by forming a stud of conductive material over a metallization layer, and then overcoating the stud of conductive material and the metallization layer with a layer of compliant dielectric material. In one embodiment, the layer of compliant dielectric material is low Young's modulus silicon dioxide, formed by sputter-deposition at low temperature, in a low pressure argon atmosphere. The interconnect may provide electrical access to a micromechanical device, which is enclosed with a capping wafer hermetically sealed to the substrate with an $AuIn_x$ alloy bond.

18 Claims, 15 Drawing Sheets

U.S. PATENT DOCUMENTS

| | | | |
|---|---|---|---|
| 2002/0113259 A1* | 8/2002 | Thomas | 257/296 |
| 2003/0104651 A1* | 6/2003 | Kim et al. | 438/106 |
| 2004/0182509 A1* | 9/2004 | Farquhar et al. | 156/250 |
| 2005/0059204 A1 | 3/2005 | Heschel | |
| 2005/0082577 A1* | 4/2005 | Usui | 257/211 |
| 2005/0142896 A1* | 6/2005 | Imai et al. | 438/795 |
| 2005/0145994 A1* | 7/2005 | Edelstein et al. | 257/642 |
| 2005/0200021 A1* | 9/2005 | Ito et al. | 257/758 |
| 2005/0253282 A1* | 11/2005 | Lu et al. | 257/787 |
| 2007/0060970 A1* | 3/2007 | Burdon et al. | 607/37 |
| 2007/0158787 A1* | 7/2007 | Chanchani | 257/619 |

OTHER PUBLICATIONS

"Copper Metallization of Semiconductor Interconnects—Issues and Prospects", Uziel Landau, Invited Talk, CMP, Symposium, Abstract # 505, Electrochemical Society Meeting, Phoenix, AZ, Oct. 22-27, 2000.

* cited by examiner

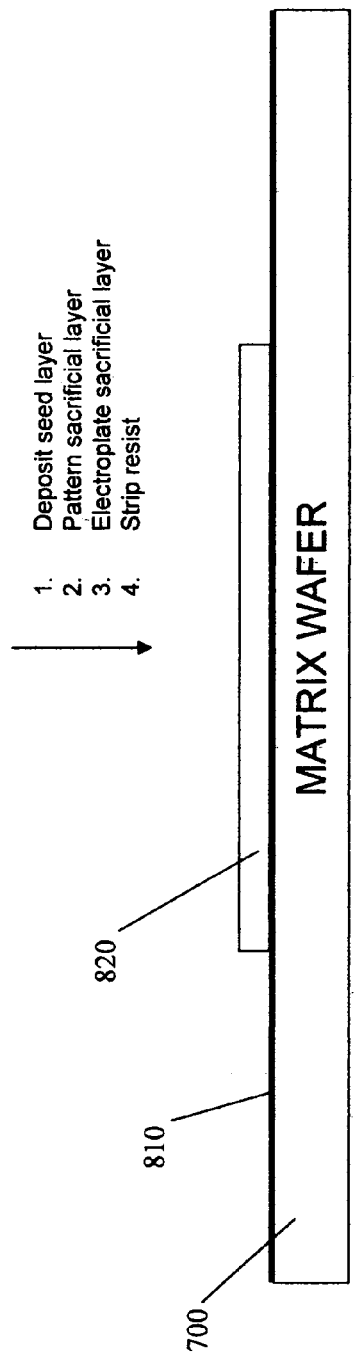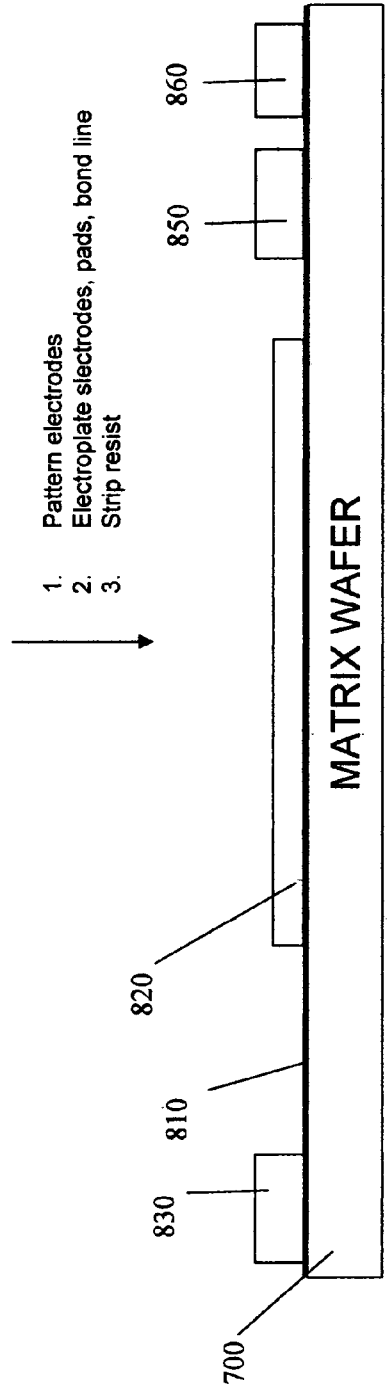

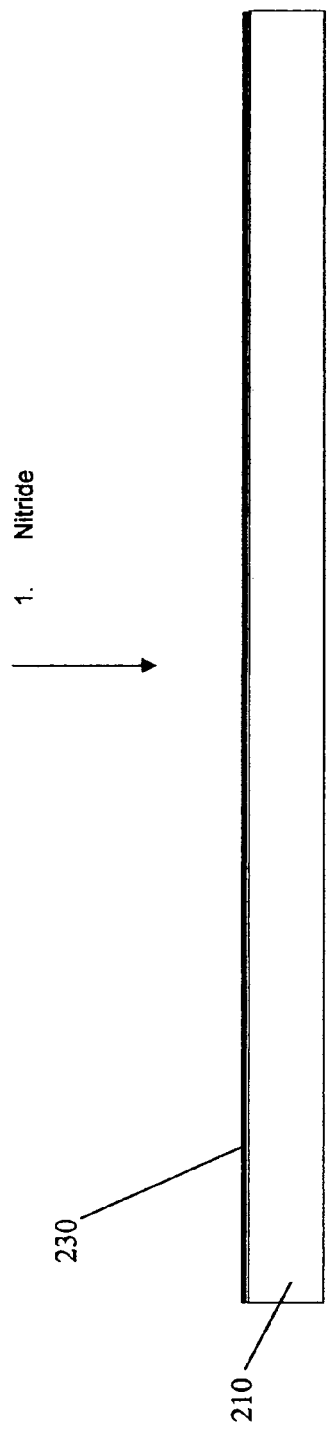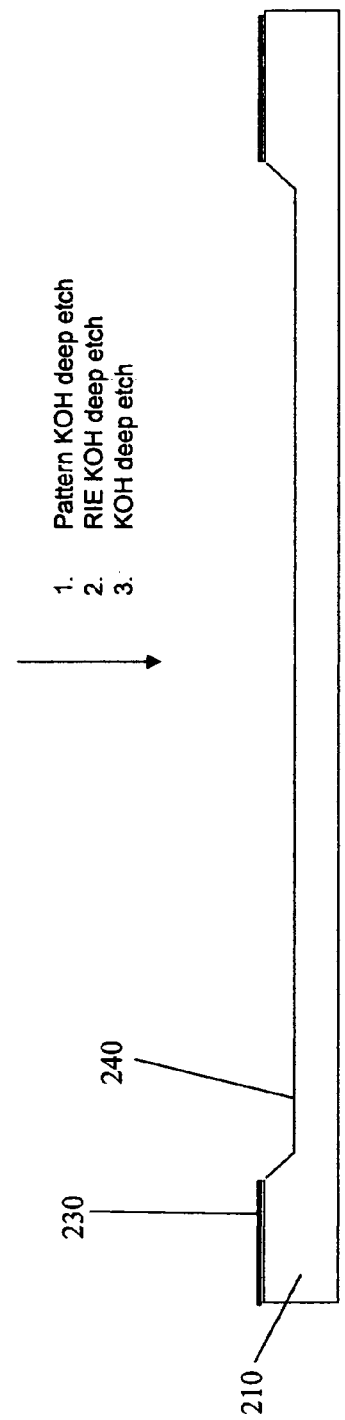
Fig. 14
Fig. 15

HERMETIC INTERCONNECT STRUCTURE AND METHOD OF MANUFACTURE

CROSS REFERENCE TO RELATED APPLICATIONS

This U.S. Patent Application is related to U.S. patent application Ser. No. 11/211,623, U.S. patent application Ser. No. 11/211,622, and U.S. patent application Ser. No. 11/211,624, filed on an even date herewith, each of which is incorporated by reference in its entirety.

STATEMENT REGARDING FEDERALLY SPONSORED RESEARCH

Not applicable.

STATEMENT REGARDING MICROFICHE APPENDIX

Not applicable.

BACKGROUND

This invention relates to interconnect structures for connecting one plane of metallization to another plane of metallization in order to provide electrical access to a device. In particular, this invention relates to a method for forming interconnect structures which maintain a hermetic seal of the enclosed device.

Telephone and other communications devices require a large number of switches to form the connections to activate the telephone calls. In general, the switches may be configured to connect any input line to any output line, and may therefore form a "cross connect." In order to miniaturize the component, the individual switches, of which there may be on the order of hundreds or even thousands, may be made using microelectromechanical systems, or MEMS. One common example of a MEMS switch usable for making a telephone cross connect is a bi-metal strip, wherein two dissimilar metals are laminated against each other to form each of two arms of the bimetal switch. By applying a current to the arms of the switch, the bi-metal switch heats up. The different coefficients of thermal expansion of each material cause each arm of the bi-metal switch to bend in a particular direction, establishing or discontinuing contact with the other arm of the bi-metal switch, for example. Therefore, the plurality of switches may be activated by delivering current to each arm of the switch, in order to heat the switch and drive it to its closed (or open) position.

The voltages carried in the telephone connections can exceed 400 V, and because of the large number of lines being connected by the cross connect, the cross connect may be required to carry an ampere or more of current. Because of these current and voltage requirements, many telephone switches are hermetically enclosed in insulating gas environments which inhibit arcing between the high voltage lines. Such insulating gases may include, for example, sulfur hexafluoride ($SF_6$) or freons $CCl_2F_2$ or $C_2Cl_2F_4$. The use of such insulating gases may increase the breakdown voltage compared to that of air by about a factor of three.

However, in order to seal the insulating gases in the switch device, the adhesive material which forms the bond between the substrate containing the electrical connections to the switches, and the cap layer which encloses the switch, must be a hermetic, i.e., non-leaking seal. As is clear from the preceding discussion, the term "hermetic" as used herein should be understood to mean preventing the transmission of gases therethrough.

Furthermore, the electrical leads which provide electrical access to the switch device must be capable of carrying relatively high currents, and relatively high voltages. In order to keep the resistance low, and therefore the generated heat low, the electrical leads must be made relatively thick, and need to be well separated from each other in order to reduce capacitive coupling between the leads. The reduction in capacitive coupling is particularly important for leads carrying high frequency signals, such as telephone signals.

Therefore, for cross connect structures such as telephone switches, a relatively larger number, for example, 96 switches, need to be accessed electrically. As each switch may require a activation lead, a ground lead, and a signal line, a 96 switch device may require 96×2×3 electrical leads, or 576 electrical leads. If the two sides of the switch share a ground lead, this translates into 480 electrical connections. In order to avoid routing all of these electrical connections in a single plane out to bonding pads at the periphery of the device, the connections may be made in, for example, two or more parallel planes of conductor metallizations. Interconnections may then be made between the planes to access each of the electrical devices.

SUMMARY

Typically, interconnection between metallization layers may be made on a printed circuit board, however this technology does not form a hermetic seal and may therefore not be suitable for telephone switches.

Interconnection technology is also well known in the semiconductor arts, as the formation of vias between metallization layers. However, this via methodology may not be applicable to telephone switches, because of the thick insulating layers used to reduce capacitive coupling between the metallization layers, and the relatively thick metal layers required to transport large amounts of current.

Other methods for forming interconnections may be employed, such as plating interconnect studs through the insulating layer. However, the interface between the plated layer and the insulating layer may also not form a hermetic seal, as voids often form when plating into very high aspect ratio features. In addition, if rigid glass or other dielectric is used as the insulating layer, cracks may form at the interface when the device is operated over a wide temperature range, because the glass or other dielectric cannot accommodate the different coefficients of thermal expansion of the materials in the switch.

Systems and methods are described here for formation of an interconnect matrix which is hermetic, and interconnects relatively thick metallization leads embedded in a relatively thick insulating layer. This interconnection technology is therefore suitable for manufacturing telephone switches. The hermetic interconnection formed thereby may be used over a relatively large temperature range without forming leaks.

The hermetic interconnection is formed by first plating a metal stud into a hole in a layer of photoresist over a first plated metallization layer. The metal stud and metallization layer are then conformally overcoated with a thick but compliant glass layer, which provides the insulation between layers. The glass layer is planarized, and then plated with a second metallization layer, upon which a second metal stud is plated. The stud and second metallization layers are then again overcoated with a compliant glass layer. The stud and glass layer are then planarized to allow further depositions for forming the switch on the planarized surface. These process steps may be repeated n times, to provide an n-layer interconnect structure.

The compliance of the glass layers allows the entire package to operate over a large temperature range without cracking or otherwise forming leak paths, because the compliant glass can absorb some shifts which occur because of their varying coefficients of thermal expansion of the various material of the switch package. Such cracks may otherwise have destroyed the hermeticity of the package. The glass or other dielectric layers thereby form a hermetic barrier, or hermetic seal.

These and other features and advantages are described in, or are apparent from, the following detailed description.

BRIEF DESCRIPTION OF THE DRAWINGS

Various exemplary details are described with reference to the following figures, wherein:

FIG. 10 is an exemplary first step in the formation of the switch structure of the hermetic switch;

FIG. 11 is an exemplary second step in the formation of the switch structure of the hermetic switch;

FIG. 14 is an exemplary first step in the formation of the cap layer of the hermetic switch;

FIG. 15 is an exemplary second step in the formation of the cap layer of the hermetic switch

DETAILED DESCRIPTION

In the systems and methods described herein, a hermetic interconnect structure is fabricated which may be particularly suited for telephone switches which may need to accommodate a large number of electrical leads. The leads may be required to carry large voltages and large currents, and may therefore be thick and separated by thick insulating layers. Although the systems and methods are described with respect to a telephone switch embodiment, it should be understood that this embodiment is exemplary only, and that the systems and methods may be applied to any system carrying high currents and high voltages, and requiring a hermetic seal.

Furthermore, the systems and methods are described with respect to a particular design of MEMS switch. However, it should be understood that this particular design of MEMS switch is exemplary only, and that the systems and methods described herein can be applied to any number of alternative designs of MEMS switches or other devices.

It should also be understood that in the figures which follow, the various dimensions are not necessarily drawn to scale, but instead are intended to illustrate the important aspects of the features.

Figure 1:
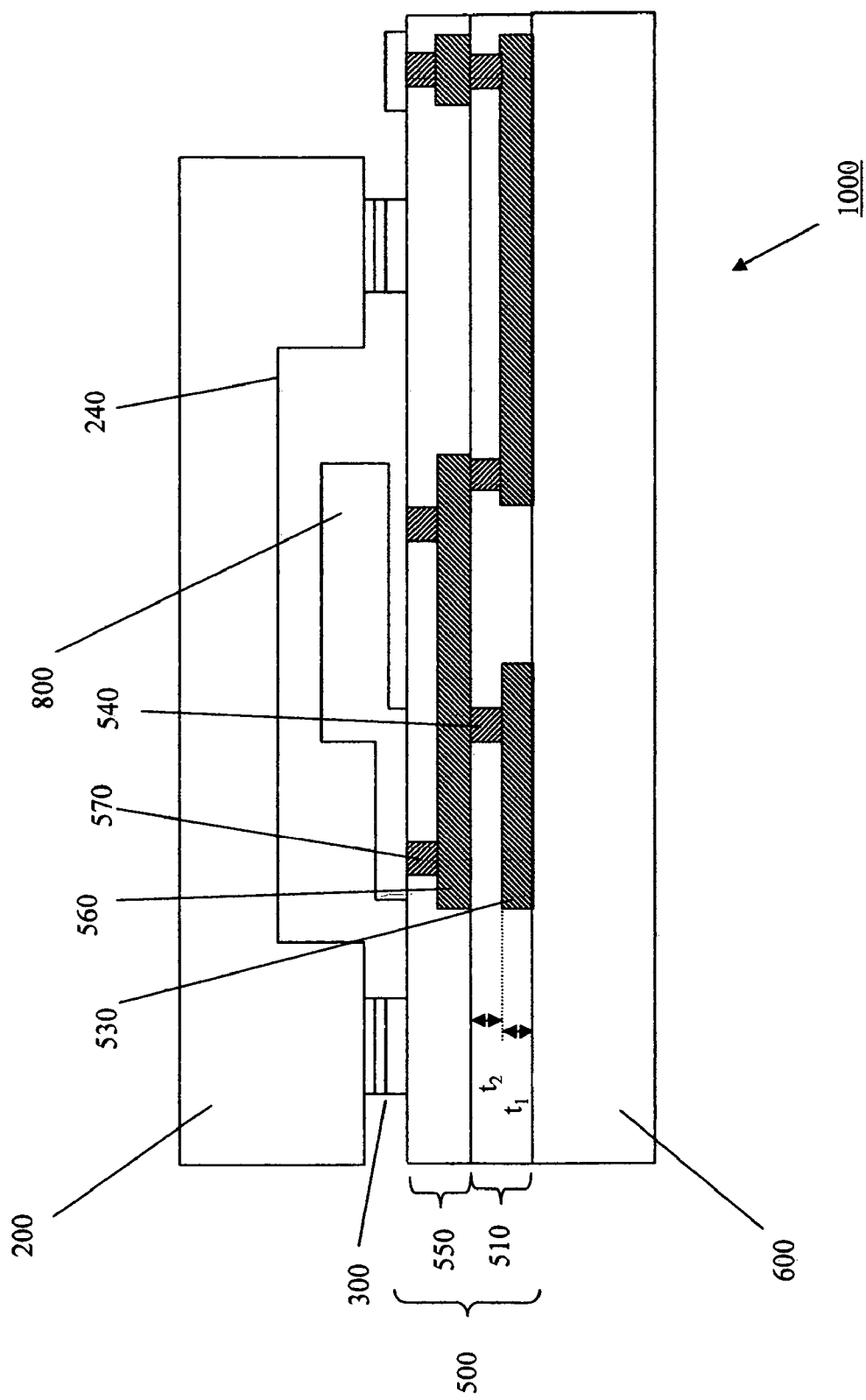
FIG. 1 is an exemplary embodiment of a hermetic switch package with hermetic interconnect structure.

FIG. 1 is a cross sectional side view of hermetic switch device 1000. Hermetic switch device 1000 includes a lid or cap 200, which covers and seals a switch structure 800 in a hermetic cavity 400. Although only a single switch structure 800 is shown in FIG. 1, it should be understood that in actuality there may be far more switches, for example 96, enclosed under a single lid 200. The lid or cap 200 is secured to the interconnect layers 500 by an alloy seal 300. The lid or cap 200 may be a metal lid, such as a silicon substrate, within which an area 240 is relieved to provide clearance for the switch structure 800. This area 240 may define the hermetic cavity 400 of the switch device 1000. Alternatively, the lid or cap 200 may be a transparent glass plate, or it may be a ceramic. The switch structure 800 is formed over interconnect layers 500, which are in turn formed on a substrate 600. The substrate 600 may be any convenient material, such as thermally oxidized silicon, which is widely used in semiconductor processing, which may provide a fabrication plane for the interconnect layers 500 and the switch structures 800.

The interconnect layers 500 may include two interconnect layers 510 and 550. Each of the interconnect layers 510 and 550 further includes a plated layer of metallization 530 and 560, respectively, and a plated stud, 540 and 570, respectively. The word "stud" is used herein to denote a feature with a relatively tall aspect ratio, that is, compared to the layers of metallization 530 and 560, the studs 540 and 570 may be relatively tall compared to their width. Coating each interconnect layer 510 and 550 is a layer of dielectric material. Although the embodiment illustrated in FIG. 1 has only two such interconnect layers 510 and 550, it should be clear that the techniques described herein can be applied to any number of interconnect layers.

The thickness $t_1$ of the first metallization layer may be, for example, about 4 µm, and the thickness $t_2$ of the plated stud 540 may also be, for example, about 4 µm. However, it should be understood that these thicknesses are exemplary only, and the metal layers and studs may be made of any thickness and width required to carry the specified current and dissipate the resulting heat.

The formation of hermetic switch device 1000 will be described first with respect to the interconnect layers 500, then with respect to the formation of the MEMS switch structures 800, and finally with respect to the cap or lid 200.

Figure 2:
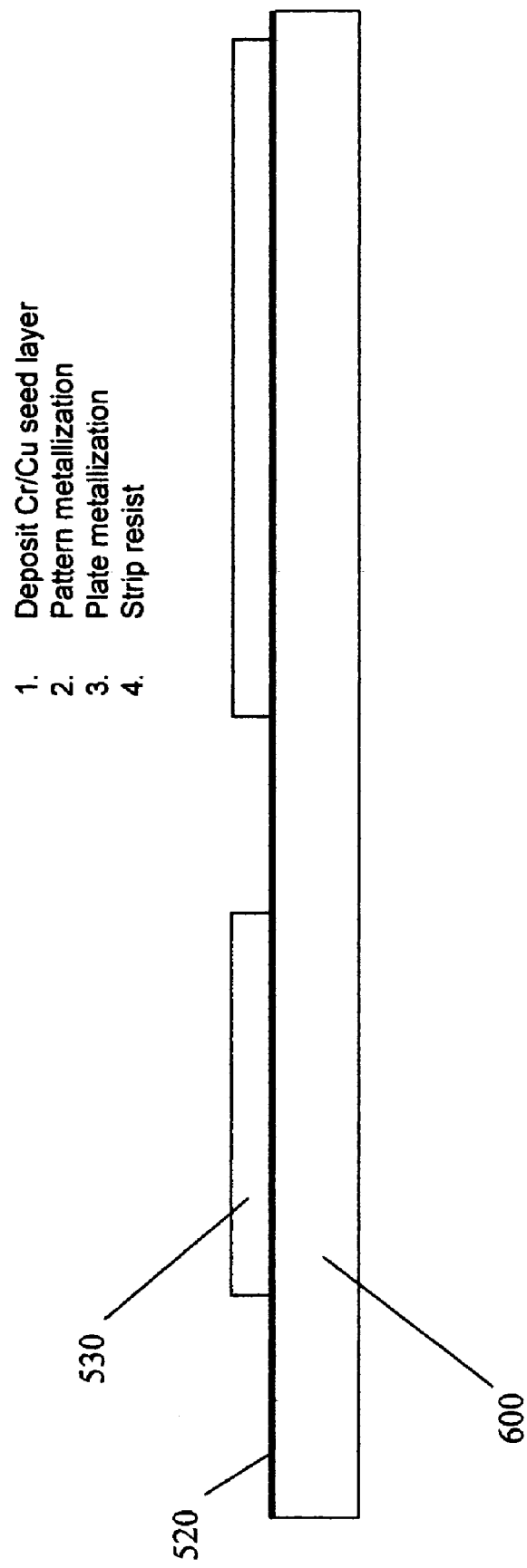
FIG. 2 is an exemplary first step in the formation of a first hermetic interconnect structure.

FIG. 2 is a cross sectional view illustrating a first step in the fabrication of interconnect layer 510. First, any standard seed layer, such as a seed layer 520 of chrome (Cr) and copper (Cu) is deposited over a substrate 600. The substrate 600 may be, for example, thermally oxidized silicon. The seed layer 520 may be deposited by, for example, chemical vapor deposition (CVD) or sputtering to a thickness of, for example, between 100 and 200 nm. It should be understood that this thickness is exemplary only, and that the thickness may be chosen according to the electroplating requirements.

The seed layer 520 may then be covered with a photoresist, and patterned using a photolithographic mask. If the photoresist is a positive photoresist, the exposed areas of the photoresist are then developed and removed, leaving exposed seed layer material 520 where the photoresist has been removed. Alternatively, using a negative photoresist, the unexposed areas may be removed. Therefore, for this first step in the fabrication of interconnect layer 510, as well as for subsequent applications of photoresist to be described later in the process, either positive or negative photoresist may be used. The metallization layer 530 may then be electroplated with copper over the seed layer 520 to a thickness of about 4 μm to about 8 μm, for example. The plating solution may be any standard commercially available or in-house formulated copper plating bath. Plating conditions are particular to the manufacturer's guidelines. However, any other conductive material that can be electroplated may also be used. In addition, deposition processes other than plating may be used to form metallization layer 530. Finally, the resist is stripped in preparation for a second step illustrated in FIG. 3. It should also be understood that the thickness of the metallization layer may be chosen to provide adequate resistance and capacitance characteristics, and may depend on the application.

Figure 3:
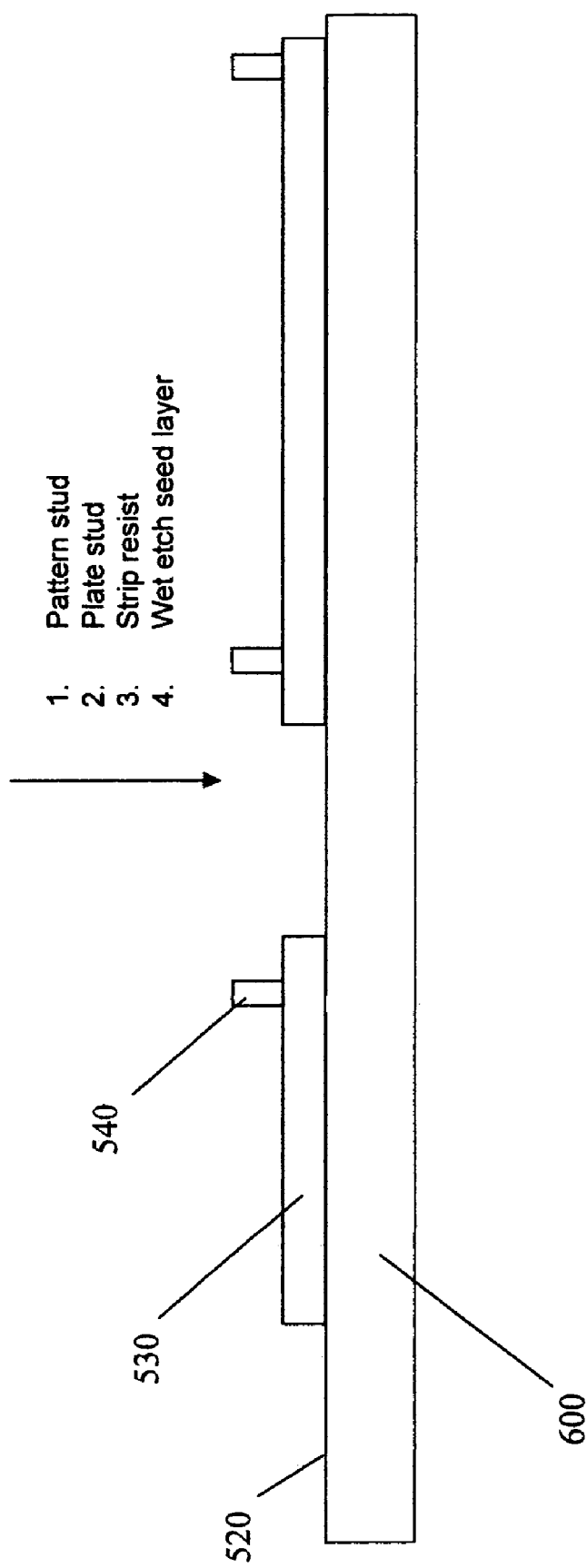
FIG. 3 is an exemplary second step in the formation of the first hermetic interconnect structure.

FIG. 3 illustrates the second step of forming the interconnect layer 510. In the second step, photoresist is again applied over the substrate, and exposed using a mask. The mask illuminates features where the studs 540 will be formed. The exposed areas of the photoresist may then be removed, leaving an exposed region of underlying plated copper 530 as a seed layer for the plating of the stud 540. The exposed areas may then be electroplated with copper using the same electroplating process described above with respect to the formation of metallization layer 530. However, any other conductive material that can be electroplated may also be used, and other deposition processes rather than plating may be used to form the stud 540. The thickness of the copper stud 540 may be about 6-8 μm, or any convenient thickness which will allow a budget for the chemical mechanical planarization process to follow. The photoresist is then removed, and the Cr/Cu seed layer 520 is etched from the surface of substrate 600.

One unusual aspect of the process described here is that lithographic processing is performed directly on features which were previously defined using lithographic processes. That is, lithography is performed on features which have not been planarized using, for example, chemical mechanical polishing. This is made possible by using relatively thick, viscous resist designed to create 10-15 μm coatings under standard processing conditions. The thick resist is then used to define relatively large features, such as the copper stud 540, with relatively large dimensions. For example, the diameter of the copper stud 540 may be about 6 to about 8 μm on a metallization 530 which is 12 or more μm in width. More generally, the stud may be anywhere from about 6 μm to about 100 μm in diameter. It should be understood that these dimensions are exemplary only, and that other dimensions may be chosen depending on the performance requirements of the device.

Figure 4:
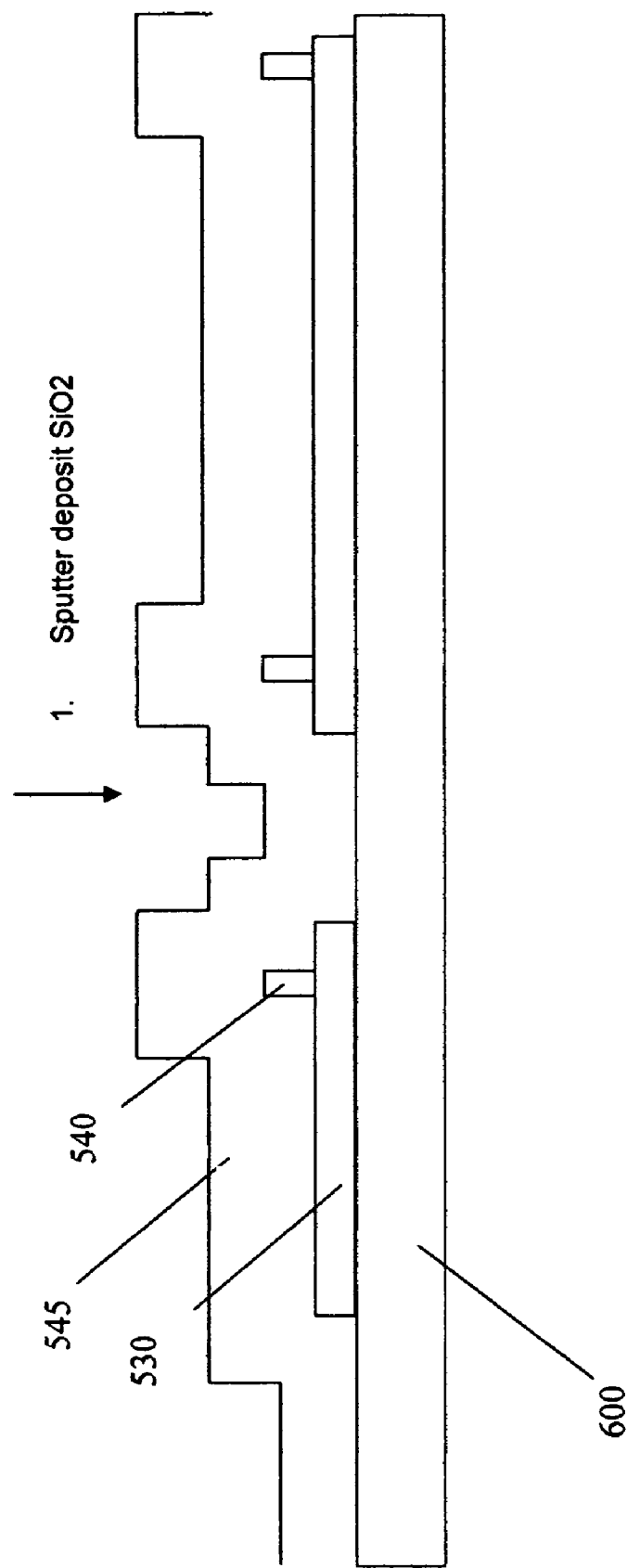
FIG. 4 is an exemplary third step in the formation of the first hermetic interconnect structure.

FIG. 4 illustrates a third step in the fabrication of the interconnect layer 510. In step three, the dielectric coating 545 is applied conformally over the surface of plated structures 530 and 540. The dielectric material 545 may be $SiO_2$, which has been sputter-deposited under specific conditions to reduce the Young's modulus of the $SiO_2$. The thickness of the $SiO_2$ layer 545 may be about 6 to about 12 μm. The $SiO_2$ layer 545 may be deposited at low temperature in a low pressure argon (Ar) atmosphere. The temperature of the substrate may be cooled to a temperature less than the process temperature, for example, cooled to about 100 degrees centigrade, and more preferably, less than about 80 degrees centigrade, and at an argon pressure of less than about 30 milliTorr, and more preferably less than about 20 milliTorr, or between about 10 to about 20 milliTorr.

The $SiO_2$ deposited under these conditions may have relatively low density and be quite porous, with a substantial amount (about 12% by weight) of Ar incorporated into the $SiO_2$ matrix. Although the material is porous, there are few or no through holes which would destroy the hermiticity of the film. The $SiO_2$, dielectric coating 545 thereby forms a hermetic barrier, or hermetic seal for the hermetic cavity 400. The resulting $SiO_2$ film 545 may be compliant, i.e. have a Young's modulus of less than about 20 GPa, and more preferably less than about 12.5 GPa, compared to a Young's modulus of $SiO_2$ films prepared at high temperature of about 75 GPa. The low Young's modulus may suggest that this material is relatively compliant, and therefore may accommodate the shifts in position of the films adhered above and below the $SiO_2$ film through a varying range of temperatures. These shifts may occur as a result of different coefficients of thermal expansion possessed by the different materials, for example, silicon and copper, above and below the $SiO_2$ layer 545.

It should be understood that other dielectric materials may be used in place of $SiO_2$, as long as the material has similarly good compliance. For example, alumina $Al_2O_3$ may be used in place of $SiO_2$, as long as it has a similar Young's modulus.

Figure 5:
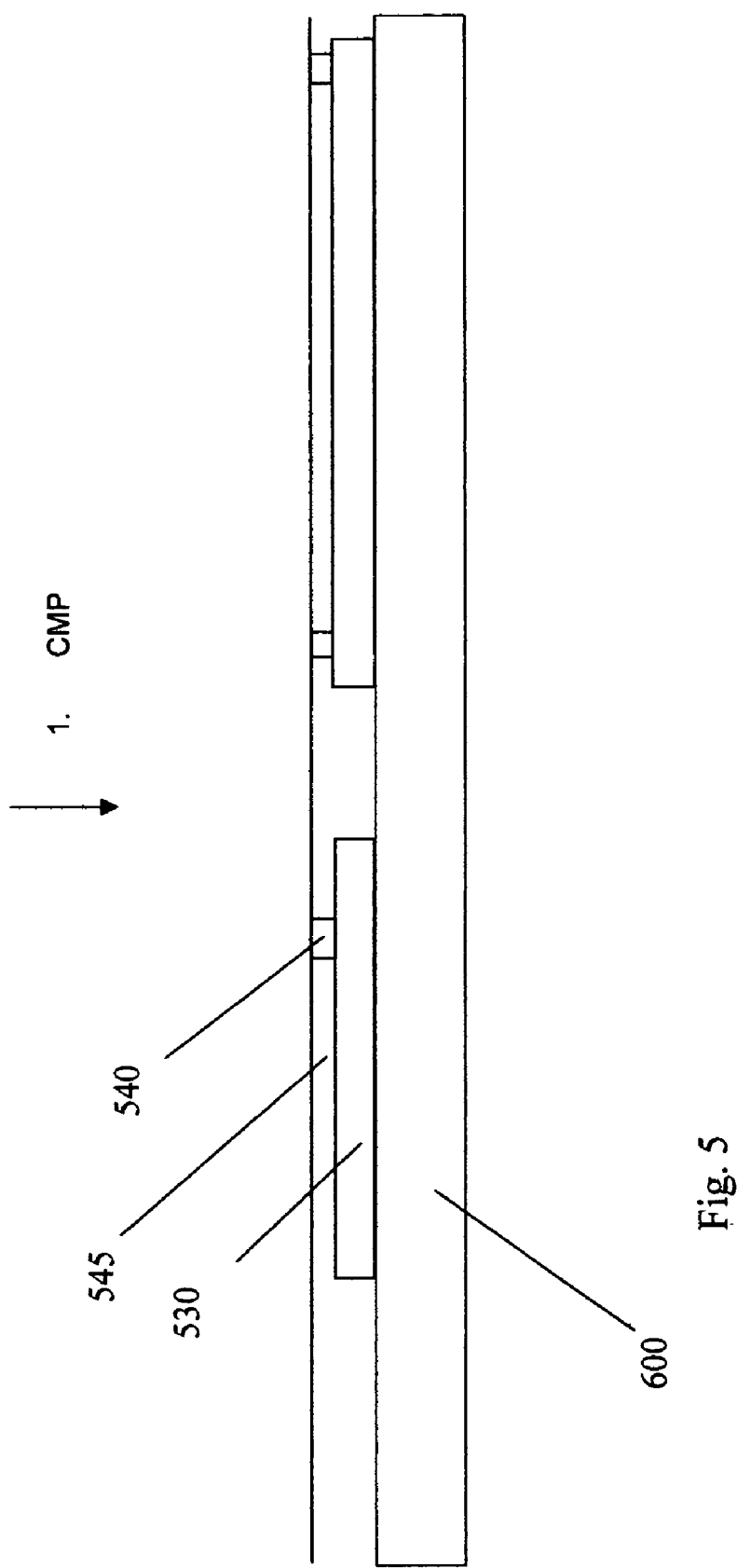
FIG. 5 is an exemplary fourth step in the formation of the first hermetic interconnect structure.

FIG. 5 illustrates a fourth step in the fabrication of interconnect layer 510. In this step, the surface of the $SiO_2$ covered wafer may be planarized using chemical mechanical polishing (CMP), for example. This step removes the excess material in the $SiO_2$ layer 545 and part of the copper stud 540, so that the surface of the $SiO_2$ layer 545 is flush with the top surface of the copper stud 540. After this planarization, additional photolithography can be performed on the surface of the $SiO_2$ layer 545 and copper stud 540. The remaining thickness of the copper stud 540 and $SiO_2$ layer 545 over the underlying metallization layer 530 may be, for example, at least about 2 μm to about 4 μm, on a metallization layer 530 which may also be at least about 2 μm to about 4 μm thick. It should be understood that these dimensions are exemplary only, and that the dimensions may be chosen according to the capacitance and current requirements of the particular application.

Figure 6:
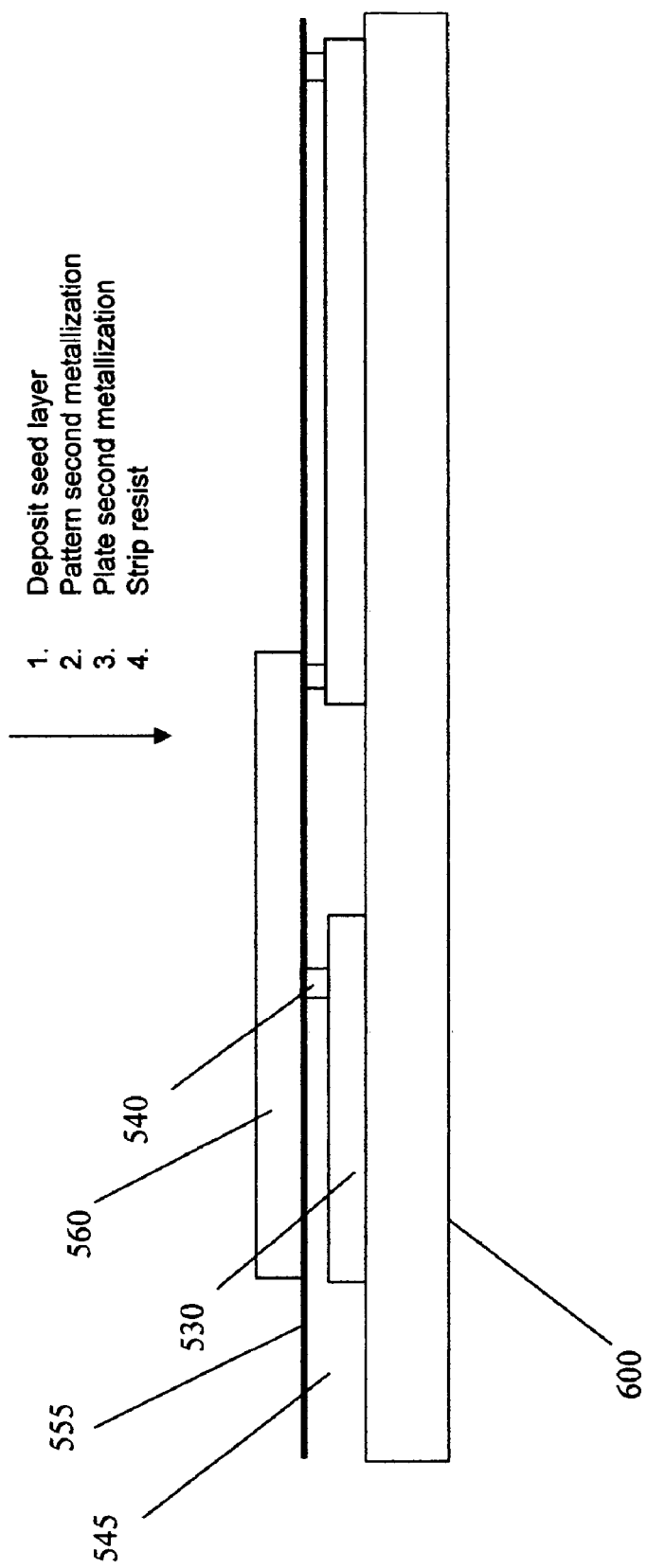
FIG. 6 is an exemplary first step in the formation of a second hermetic interconnect structure.

FIG. 6 illustrates a first exemplary step in the fabrication of interconnect layer 550. The first step includes the deposition of another Cr/Cu seed layer 555 over the planarized surface of interconnect layer 510. A layer of photoresist may then be spun or otherwise deposited over the seed layer 555, and the photoresist layer may be patterned as before with the first interconnect layer 510, to form the pattern of the second metallization layer 560. The photoresist may be developed and removed over the exposed areas. The metallization layer 560 may then be electroplated onto the seed layer 555. The metallization layer may be plated copper, for example. However, any other conductive material that can be electroplated or otherwise deposited may also be used. The thickness of the second metallization layer 560 may be similar to that of the first metallization layer 530, and may be, for example, 4 μm thick. The electroplating process may be similar to, or the same as that used to deposit the first metallization layer 530.

Figure 7:
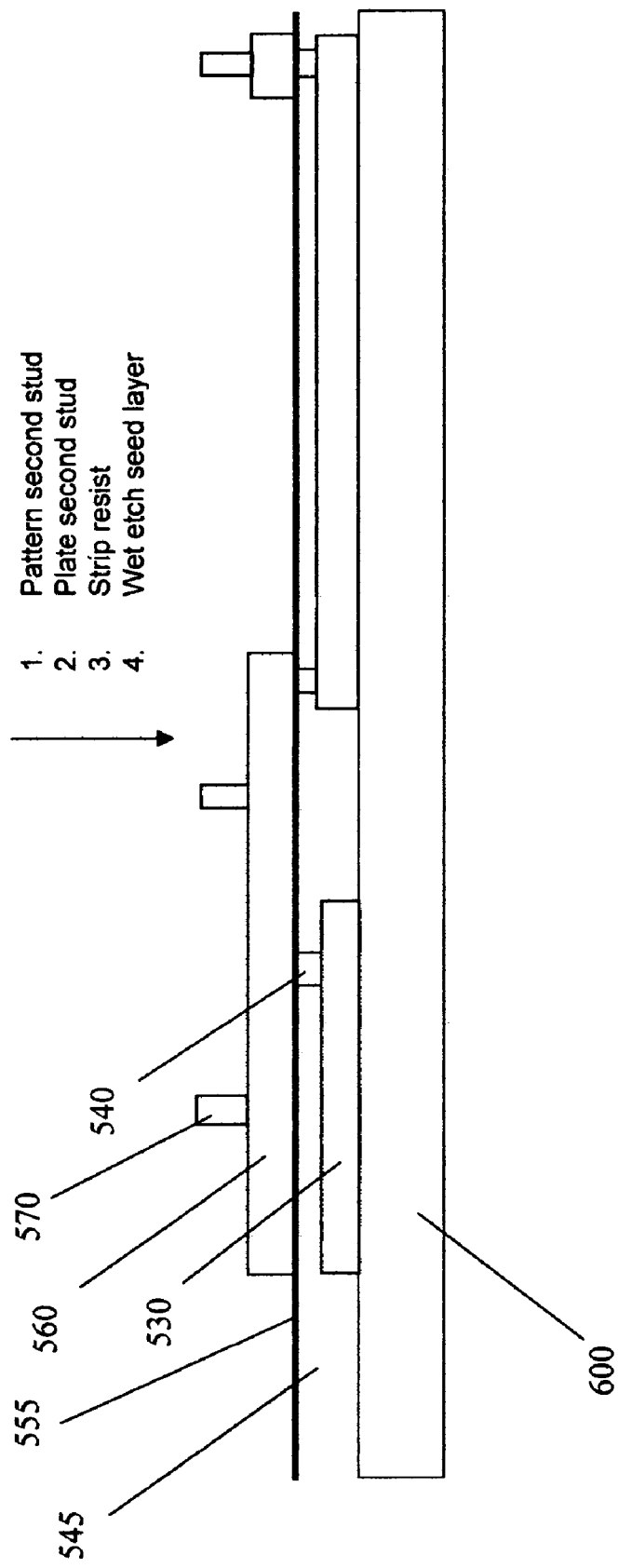
FIG. 7 is an exemplary second step in the formation of the second hermetic interconnect structure.

FIG. 7 illustrates a second exemplary step in the fabrication of interconnect layer 550. The second step includes the formation of the second stud 570, which will connect the MEMS switch structure 800 electrically to the metallization layers 560 and 530. To form the second stud 570, photoresist is first spread over metallization layer 560. To perform lithography on this already patterned surface, it may be helpful to use relatively thick, viscous photoresist, designed for thick coatings under standard process conditions, as was done for coating the first metallization layer 530 prior to deposition of plated stud 540.

Upon application of the photoresist, the photoresist is exposed through a mask formed with features corresponding to the intended locations of the studs 570. The photoresist is then developed and removed with an appropriate solvent, to expose the appropriate area of the seed layer 555. The second stud 570 is then electroplated onto the exposed area of the first metallization layer 560. The thickness of the second stud 570 may be similar to that of the first stud 540, about 6-8 μm thick. The stud material may be, for example, copper. However, any other conductive material that can be electroplated or otherwise deposited may also be used.

Figure 8:
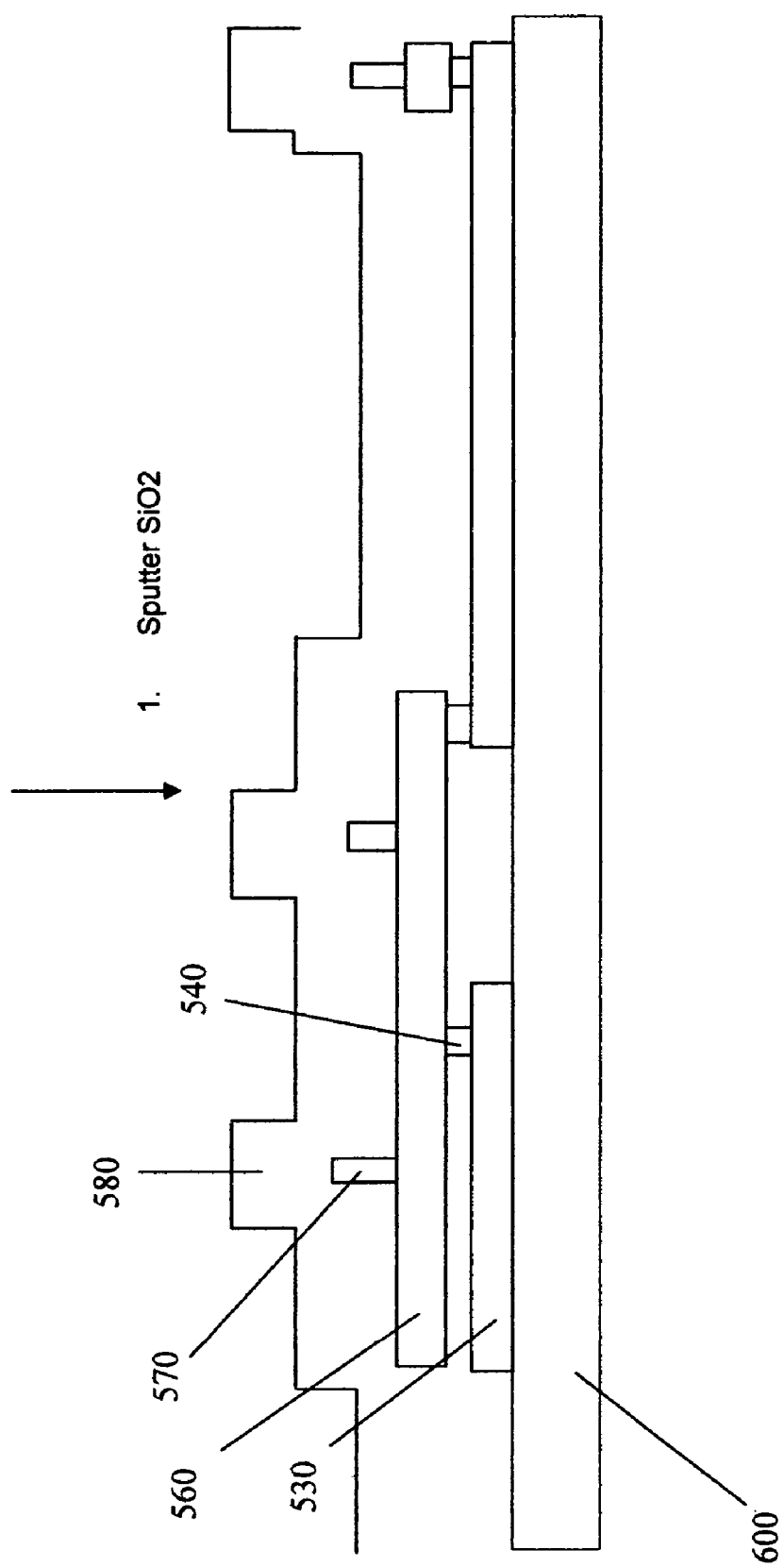
FIG. 8 is an exemplary third step in the formation of the second hermetic interconnect structure.

FIG. 8 illustrates a third exemplary step in the fabrication of interconnect layer 550. In the third step, a dielectric material 580 is deposited over the stud 570 and the second metallization layer 560. As was the case with the first interconnect layer 510, the dielectric material 580 may be silicon dioxide, which is sputter deposited under conditions which encourage the formation of a relatively compliant, low Young's modulus silicon dioxide layer 580. These conditions may include depositing the $SiO_2$ at relatively low temperature, less than about 20 degrees centigrade, and at low argon pressure, about 10-20 milliTorr. The silicon dioxide layer 580 may be about 6-12 μm thick. Thus, layers of compliant dielectric material 545 and 580 may form a hermetic seal for the hermetic cavity 400.

Figure 9:
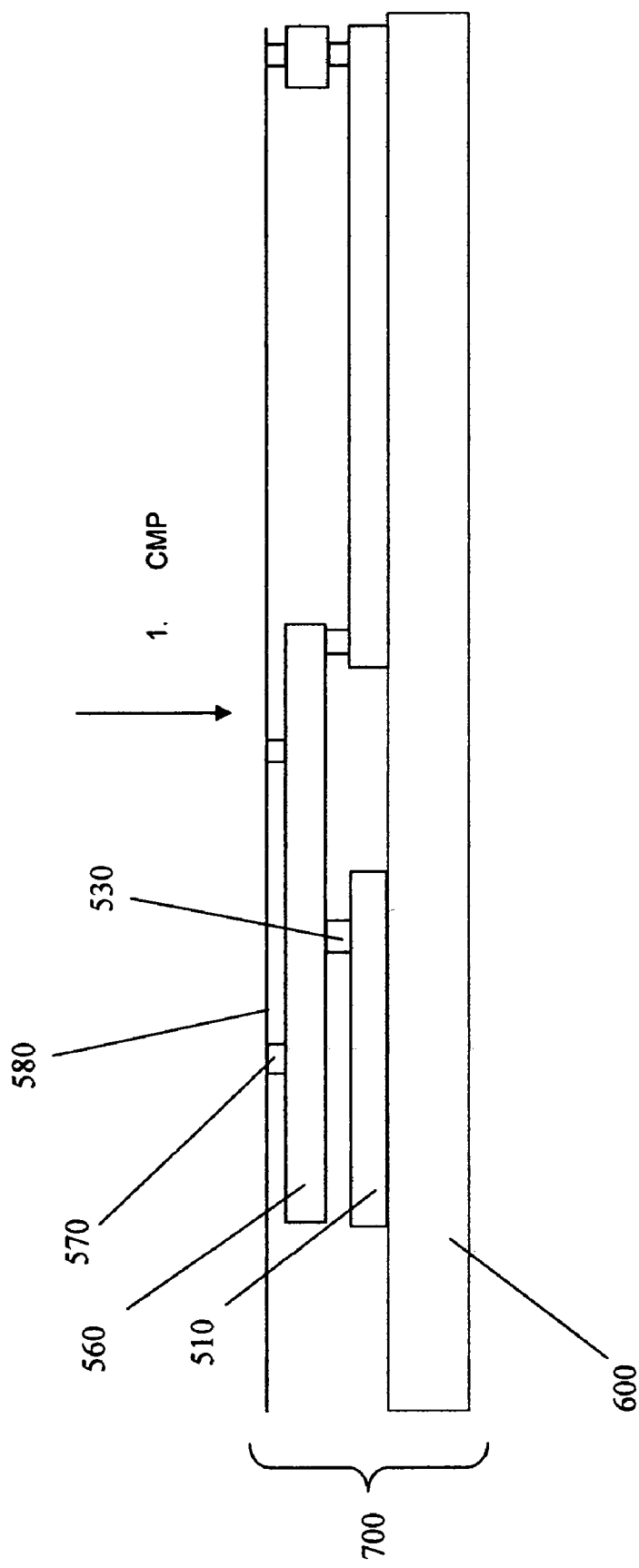
FIG. 9 is an exemplary fourth step in the formation of the second hermetic interconnect structure

FIG. 9 illustrates the last step in the process for fabricating the interconnect layer 550, which is the planarization of the dielectric layer 580. The dielectric layer 580 may be planarized in the same way that dielectric layer 545 was planarized, for example, using chemical mechanical planarization. The remaining thickness of the copper stud 570 and oxide layer 580 may be, for example, about 4 μm.

Although the process depicted in FIGS. 2-9 illustrate the formation of two interconnect layers 510 and 550, it should be understood that the techniques described above may be readily extended to the formation of an arbitrary number of additional interconnect layers. The process depicted in FIGS. 2-9 may have the advantage of having fewer planarization steps and fewer dielectric material depositions compared to other known processes.

The interconnect layers 500 are now completed, and may be used as a substrate for further processing, for example, for the formation of the MEMS device 800, as will be described next. The final stud 570 may allow electrical access to the MEMS device 800. The interconnect layers 500 along with substrate 600 are henceforth collectively referred to as the matrix wafer 700. The MEMS device 800 is described below as being a cantilevered MEMS switch. However, it should be understood that the MEMS switch embodiment is exemplary only, and that any other design or style of switch or device may be substituted for the below-described MEMS switch, including non-MEMS devices, without departing from the spirit and scope of the invention. For example, the MEMS device may be, for example, a sensor, accelerometer or actuator, which may need to be hermetically sealed but with electrical access provided to the device.

FIG. 10 illustrates a first exemplary step in the fabrication of the MEMS device 800. The process begins with the deposition of a seed layer 810 for later plating of the MEMS switch moveable member 840, over the matrix wafer 700. The seed layer 810 may be chromium (Cr) and gold (Au), deposited by chemical vapor deposition (CVD) or sputter deposition to a thickness of 100-200 nm. Photoresist may then be deposited over the seed layer 810, and patterned by exposure through a mask. A sacrificial layer 820, such as copper, may then be electroplated over the seed layer. The process for electroplating the copper sacrificial layer 820 may be the same as the electroplating process used to deposit the copper metallization layers 530, 540, 560 and 570. The photoresist may then be stripped from the matrix wafer 700.

A second exemplary step in fabricating the MEMS device 800 is illustrated in FIG. 11. In FIG. 11, the matrix wafer 700 is again covered with photoresist, which is exposed through a mask with features corresponding to a gold bonding ring 830 and 850, and an external access pad 860. The pads 830, 850 and 860, will subsequently be plated in the appropriate areas. The gold bonding pads 830 and 850 will eventually form a portion of the seal which will bond the cap layer 200 to the matrix wafer 700. The external access pad 860 will provide a pad for accessing the MEMS device 800 electrically, from outside the hermatically sealed structure.

The gold bonding pads 830, 850 and 860 may then be electroplated in the areas exposed by the photoresist, to form gold bonding pads 830, 850 and 860 and any other gold structures needed. The photoresist is then stripped from the matrix wafer 700. The thickness of the gold bonding pads 830, 850 and 860 may be, for example, 1 μm.

Figure 12:
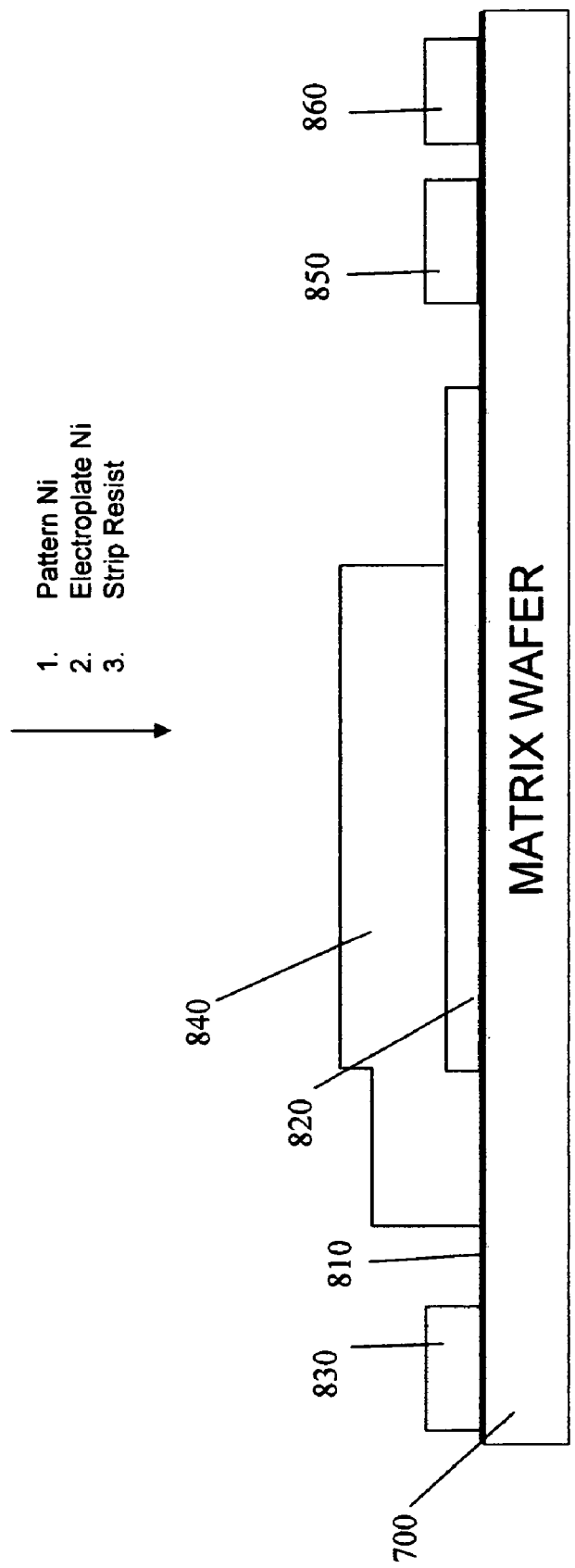
FIG. 12 is an exemplary third step in the formation of the switch structure of the hermetic switch.

FIG. 12 illustrates a third step in fabricating the MEMS device 800. In FIG. 12, photoresist is once again deposited over the matrix wafer 700, and patterned according to the features in a mask. The exposed portions of the photoresist are then dissolved as before, exposing the appropriate areas of the seed layer. The exposed seed layer 810 may then be electroplated with nickel or other appropriately selected material, to form a moveable arm 840 of the MEMS device 800.

The arm 840 may be, for example, a cantilevered arm which responds to an electrostatic force generated between two conducting plates formed between the substrate and cantilevered arm 840. Alternatively, the moveable arm 840 may be the cantilevered beam of an accelerometer. Since the details of such devices are not required for the understanding of this invention, they are not further described or depicted in FIG. 12.

Figure 13:
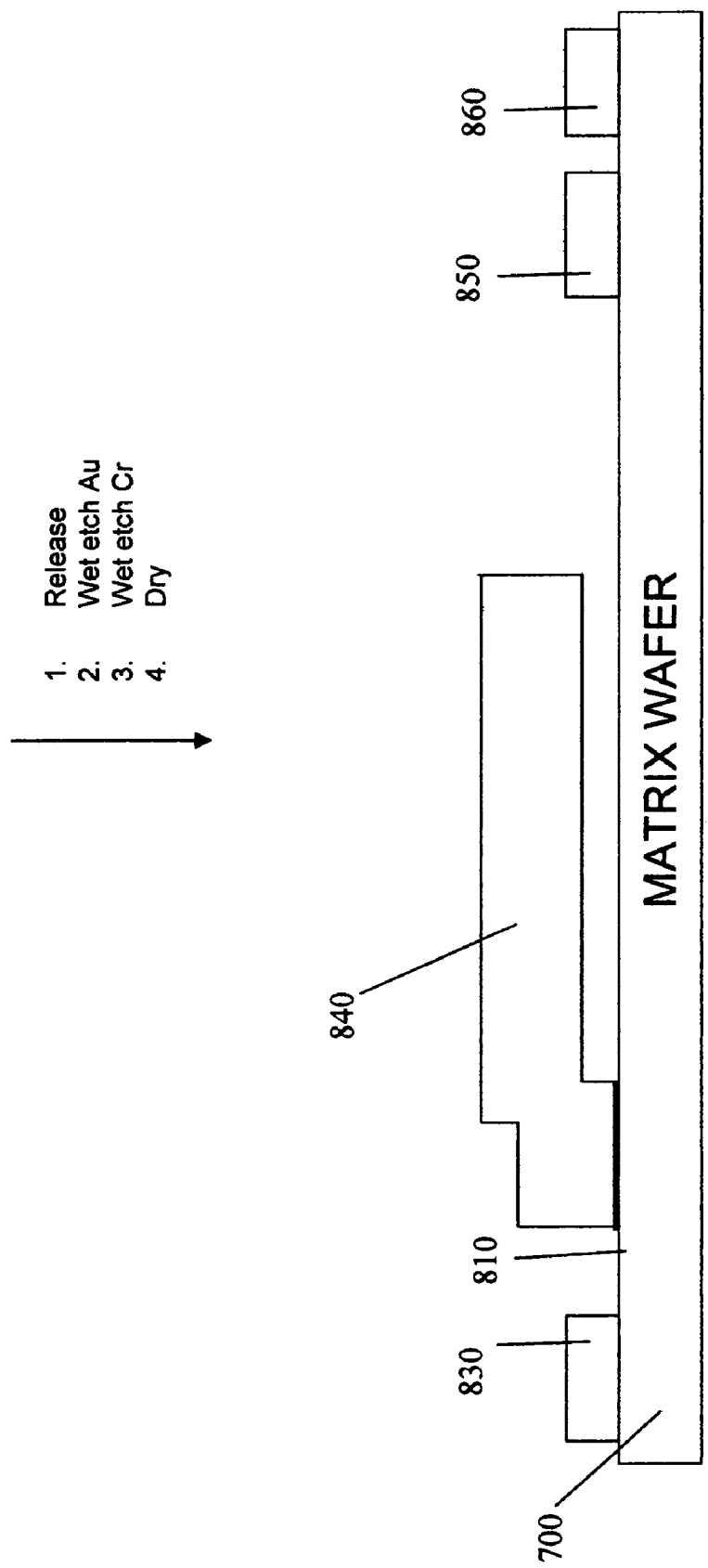
FIG. 13 is an exemplary fourth step in the formation of the switch structure of the hermetic switch.

FIG. 13 illustrates the final step in the fabrication of the MEMS device 800. In this step, the moveable arm 840 may be released by etching the sacrificial copper layer 820. Suitable etchants may be, for example, an isotropic etch using an ammonia-based Cu etchant. The Cr and Au seed layer 810 is then also etched using, for example, a wet etchant such as iodine/iodide for the Au and permanganate for the Cr, to expose the $SiO_2$ surface of the matrix wafer 700. The matrix wafer 700 and MEMS device 800 may then be rinsed and dried.

It should be understood that the external access pad 860 may be used for electrical access to the MEMS device 800, such as to supply a signal to the MEMS device 800, or to supply a voltage to an electrostatic plate in order to activate the switch, for example. The external access pad 860 may be located outside the bond line which will be formed upon completion of the cap layer 200 and matrix wafer 700 assembly, as described further below.

The process description now turns to the fabrication of the cap layer 200, and its installation over the matrix wafer 700. The process described is applicable to a silicon cap wafer. If other substrate materials are used, such as glass or ceramic or other metals, the process may be modified accordingly. As illustrated in FIG. 14, the cap wafer 200 may be a silicon substrate 210 which is first covered with a silicon nitride ($Si_2N_3$) layer 230. The silicon nitride layer 230 may then be patterned by reactive ion etching (RIE), for example, to form a hard mask for a later wet etch.

As shown in FIG. 15, a deep etch is then performed into the silicon substrate 210 through the silicon nitride layer 230 on the cap wafer 200, to provide clearance for the moveable arm 840 of the MEMS device 800. The deep etch may be performed by, for example, exposure to a potassium hydroxide etching solution. The etch depth may be, for example, several hundred μm deep.

Figure 16:
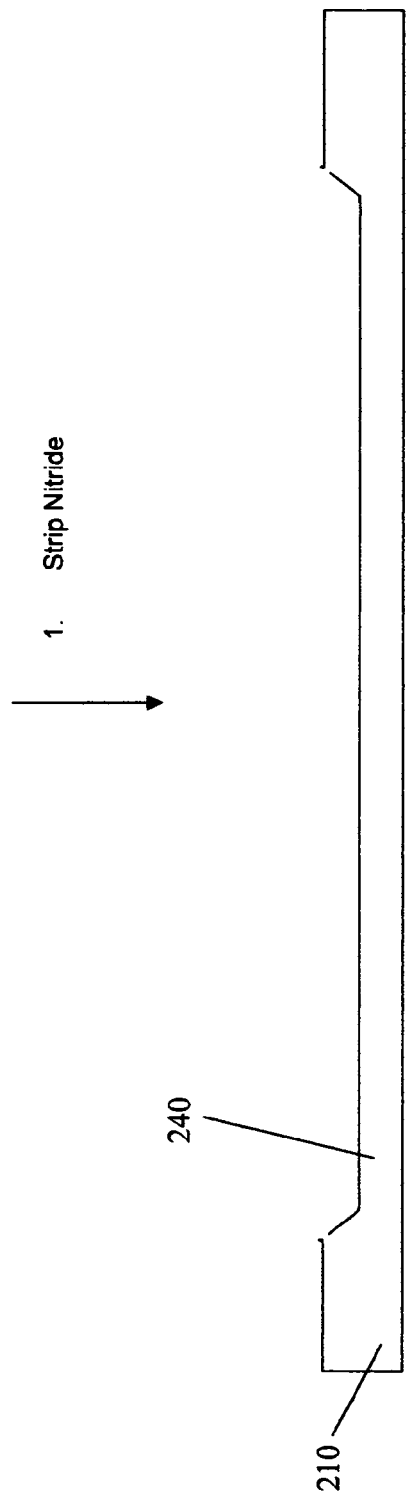
FIG. 16 is an exemplary third step in the formation of the cap layer of the hermetic switch

FIG. 16 illustrates a third step in the fabrication of cap layer 200. In FIG. 16, the nitride is stripped, leaving the bare surface of the cap wafer 200.

Figure 17:
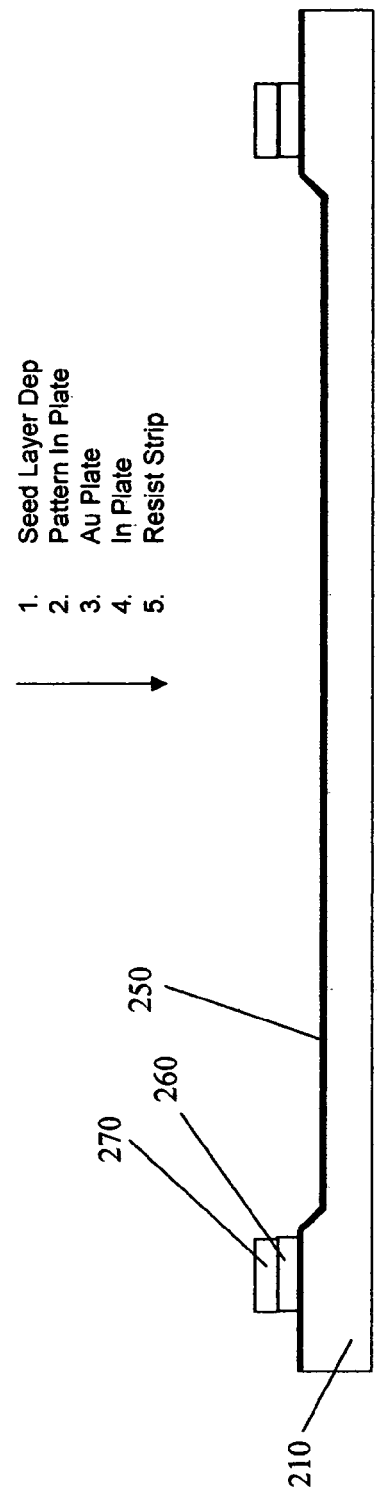
FIG. 17 is an exemplary fourth step in the formation of the cap layer of the hermetic switch.
Figure 18:
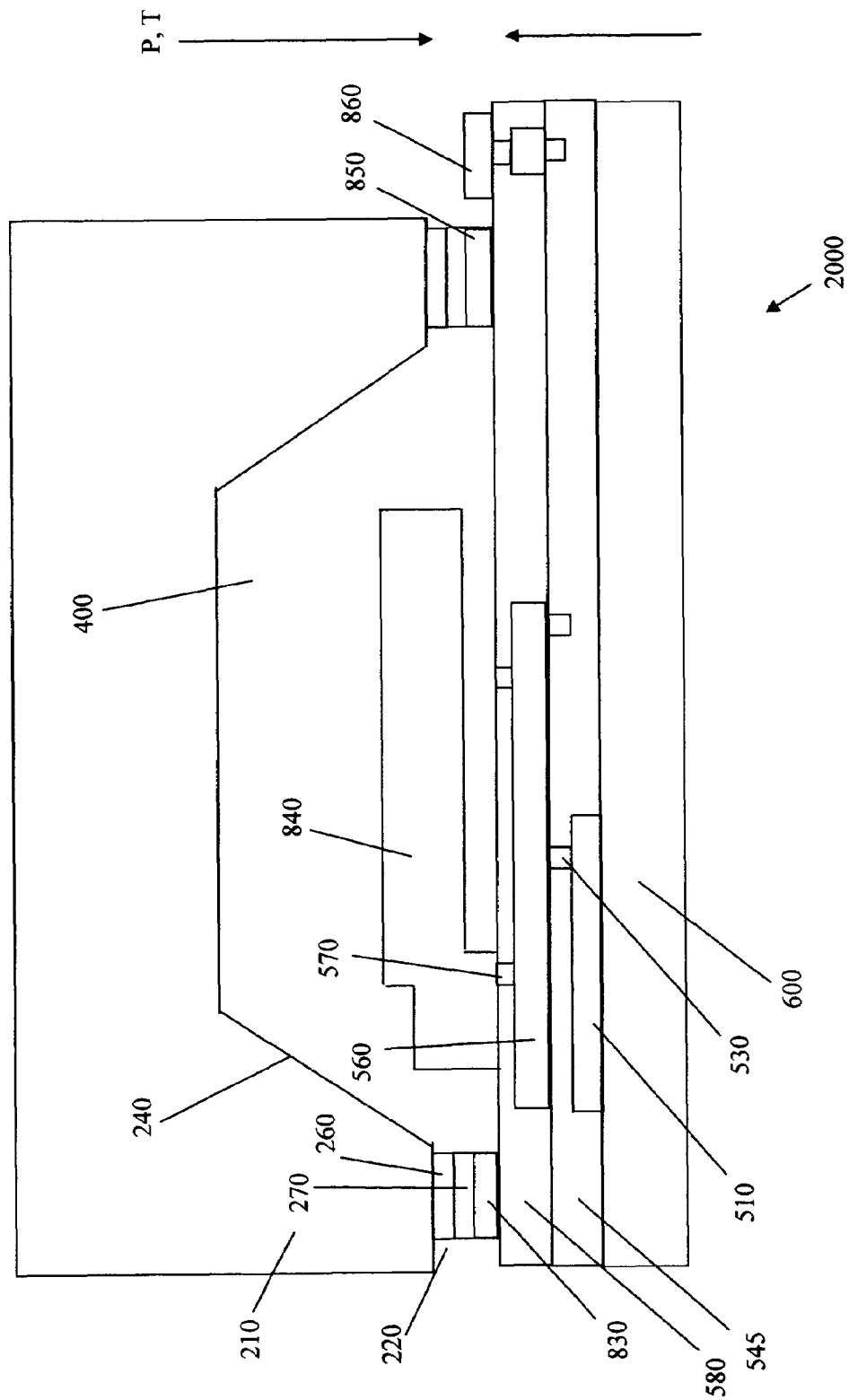
FIG. 18 is an illustration of a completed exemplary hermetic switch.

FIG. 17 illustrates a fourth step in the fabrication of the cap wafer 200. In FIG. 17, the cap wafer 200 is covered with a deposited seed layer 250, such as Cr/Au. The seed layer 250 is then covered with photoresist, which is patterned by exposure through a mask. The mask has features which correspond to the locations of the bond ring which will participate in the alloy bond to the matrix wafer 700. These locations are identified by reference number 260. The photoresist is dissolved by a suitable solvent in the region 260, to expose the seed layer 250 beneath the photoresist. A gold (Au) layer 260 is then electroplated or sputtered into these regions to a thickness of about 1 μm. After the gold is plated or sputtered, a layer 270 of indium (In) is electroplated into these same regions, to a thickness of about 3 μm to about 6 μm. The relative thicknesses of the gold to the indium may be important to control, as the proper alloy stoichiometry is about 2 atoms of indium to every atom of gold, to form an alloy AuIn and preferably to form $AuIn_2$. Since the molar volume of indium is about 50% greater than gold, a combined gold thickness of both layers 260 and 830 of about 1 μm to about 2 μm may be approximately correct to form the $AuIn_2$ alloy. This thickness of gold may provide enough gold material for forming the alloy, while still leaving a thin film of gold on the surface of the seed layer 250, to provide good adhesion to the seed layer 250.

It may be important for metallization pads 260 and 830 to be wider in extent than the plated indium layer 270. The excess area may allow the indium to flow outward somewhat upon melting, without escaping the bond region, while simultaneously providing for the necessary Au/In ratios cited above.

The cap wafer 200 may now be assembled with the matrix wafer 700 to form the hermetic switch 2000, by forming an alloy bond between the gold layer 260 and indium layer 270 located on the cap wafer 200, and the gold layer 830 located on the matrix wafer 700.

The cap wafer 200 and matrix wafer 700 with the MEMS switch 800 may first be placed in a chamber which is evacuated and then filled with an insulating gas such as sulfur hexafluoride ($SF_6$) or a freon such as $CCl_2F_2$ or $C_2Cl_2F_4$. The insulating gas is then sealed within the hermetic switch 2000 by sealing the cap wafer 200 to the matrix wafer 700 with the alloy bond formed by layers 260, 270 and 830.

To form the alloy bond between layers 260, 270 and 830, the cap wafer 200 may be applied to the matrix wafer 700 under pressure and at elevated temperature. For example, the pressure applied between the cap wafer 200 and the matrix wafer 700 may be about 0.5 to 2.0 atmospheres, and at an elevated temperature of about 160-180 degrees centigrade. This temperature exceeds the melting point of the indium (about 156 degrees centigrade), such that the indium flows into and forms an alloy with the gold. As mentioned above, the preferred stoichiometry of the alloy may be about 2 indium atoms per one gold atom, to form $AuIn_x$. In contrast to the low melting point of the indium metal, the melting point of the $AuIn_2$ alloy is about 541 degrees centigrade. Therefore, although the alloy is formed at a relatively low temperature, the durability of the alloy bond is outstanding even at several hundred degrees centigrade. The bond is therefore compatible with processes which deposit vulnerable materials, such as metals, on the surfaces and in the devices. These vulnerable materials may not be able to survive temperatures in excess of about 200 degrees centigrade, without oxidizing or degrading.

While the systems and methods described here use a gold/indium alloy to seal the MEMS switch, it should be understood that the hermetic interconnect 2000 may use any of a number of alternative sealing methodologies. For example, the seal may also be formed using an Au/Si alloy, glass frit, solder, or low-outgassing epoxy which is impermeable to the insulating gas.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, an exemplary MEMS switch is described as an application for the interconnect technology described herein. However, it should be understood that the MEMS switch is exemplary only, and that the interconnect technology may be applied to any of a wide variety of other structures or devices. Furthermore, many of the process details may be substituted by similar or equivalent processes to form the same or similar structures. Accordingly, the exemplary implementations set forth above, are intended to be illustrative, not limiting.

What is claimed is:

1. A hermetic interconnect formed on a substrate, comprising:
    a layer of metallization formed over the substrate; and
    a layer of compliant dielectric material formed over the layer of metallization,
    wherein the compliant dielectric material has a Young's modulus of less than about 20 GPa, and wherein the compliant dielectric material provides a hermetic seal, preventing the transmission of gases between at least two points, at least one of the two points being located within a hermetic cavity and the metallization providing electrical conductivity between the at least two points.
    wherein the compliant dielectric material consists essentially of silicon dioxide with about 12% by weight of argon.

2. The hermetic interconnect of claim 1, further comprising:
    a stud of conductive material formed over the layer of metallization;
    at least one additional layer of metallization formed over the stud of conductive material; and
    at least one additional stud formed over the at least one additional layer of metallization.

3. The hermetic interconnect of claim 1, wherein the layer of metallization and the stud of conductive material are each electroplated copper and at least about 2 μm thick.

4. The hermetic interconnect of claim 1, further comprising:
    a micromechanical device electrically connected to a bonding pad through the layer of metallization and the stud of conductive material.

5. The hermetic interconnect of claim 1, wherein the compliant dielectric material is at least about 2 μm thick.

6. The hermetic interconnect of claim 1 wherein the compliant dielectric layer has a thickness of between about 6 μm and about 12 μm.

7. A method for forming a hermetic interconnect on a substrate, comprising:

(1) forming a metallization layer over the substrate;

(2) forming a layer of compliant dielectric material over the metallization layer, wherein the compliant dielectric material has a Young's modulus of less than about 20GPa, and wherein the compliant dielectric material provides a hermetic seal preventing the transmission of gases between at least two points, at least one of the two points being located within a hermetic cavity and the metallization layer providing electrical conductivity between the at least two points;

wherein the compliant dielectric material consists essentially of silicon dioxide with about 12% by weight of argon.

8. The method of claim 7, further comprising: repeating steps (1)-(2) N times to form an N-layer interconnect structure.

9. The method of claim 7, further comprising forming a stud of conductive material by electroplating the conductive material into a hole formed in a layer of photoresist to a thickness of about 6 μm to about 8 μm, down to the surface of the metallization layer.

10. The method of claim 7, wherein forming the layer of compliant dielectric material further comprises:

lowering the temperature of the substrate to less than about 100 degrees centigrade;

lowering an ambient pressure of an argon atmosphere in a deposition chamber to less than about 30 milliTorr;

sputter-depositing the layer of compliant dielectric material.

11. The method of claim 7, wherein forming the metallization layer comprises electroplating a layer of copper over the substrate, to a thickness of about 4 μm to about 8 μm.

12. The method of claim 9, wherein forming the stud of conductive material comprises electroplating a stud of copper over the metallization layer, to a thickness of between about 6 μm and about 12 μm.

13. The method of claim 9, further comprising planarization a surface of the stud and compliant dielectric material, by chemical mechanical planarization.

14. The method of claim 10, wherein the layer of compliant dielectric material is sputter-deposited to a thickness of at least about 2 μm.

15. The method of claim 10, wherein the step of lowering the temperature comprises lowering the temperature of the substrate to less than about 80 degrees centigrade, and the step of lowering the ambient pressure of the argon atmosphere comprises lowering the pressure to less than about 20 milliTorr.

16. The method of claim 14, wherein the compliant dielectric material has a thickness of between about 6 μm and about 12 μm.

17. The method of claim 9, further comprising forming a microelectromechanical systems switch electrically connected to at least one bonding pad through the metallization layer and the stud of conductive material.

18. The method of claim 7, further comprising bonding a cap wafer to the substrate with an $AuIn_x$ alloy to form a hermetic seal.

* * * * *